United States Patent [19]

Temple

[11] 4,087,834
[45] May 2, 1978

[54] SELF-PROTECTING SEMICONDUCTOR DEVICE

[75] Inventor: Victor A. K. Temple, Elnora, N.Y.

[73] Assignee: General Electric Company, Schenectady, N.Y.

[21] Appl. No.: 669,403

[22] Filed: Mar. 22, 1976

[51] Int. Cl.² .................................... H01L 29/74
[52] U.S. Cl. .............................. 357/38; 357/13; 357/30; 357/55
[58] Field of Search .............. 357/38, 39, 30, 13, 357/55

[56] References Cited

U.S. PATENT DOCUMENTS

| | | | |
|---|---|---|---|
| Re. 27,440 | 7/1972 | De Cecco et al. | 357/38 |
| 3,440,501 | 4/1969 | Piccone et al. | 357/38 |
| 3,486,088 | 12/1969 | Gray et al. | 357/38 |
| 3,590,346 | 6/1971 | Bilo et al. | 357/38 |
| 3,622,845 | 11/1971 | McIntyre et al. | 357/38 |
| 3,697,833 | 10/1972 | Nakata | 357/38 |
| 3,771,029 | 11/1973 | Burtscher et al. | 357/38 |
| 3,872,493 | 3/1975 | Roberts et al. | 357/38 |
| 3,893,153 | 7/1975 | Page et al. | 357/38 |
| 3,922,774 | 12/1975 | Lindmayer et al. | 357/30 |
| 3,987,476 | 10/1976 | Sittig | 357/30 |

*Primary Examiner*—Stanley D. Miller, Jr.
*Assistant Examiner*—Joseph E. Clawson, Jr.
*Attorney, Agent, or Firm*—Mark P. Kahler; Joseph T. Cohen; Jerome C. Squillaro

[57] ABSTRACT

A self-protecting semiconductor device is provided wherein a region of localized increased avalanche multiplication factor is provided to insure that the maximum current density at the onset of avalanche voltage breakdown will occur in a known region. This current is utilized to turn-on the device in a controlled manner. In accordance with a presently preferred embodiment of this invention, the avalanche multiplication factor is increased by providing an etched down region in the gate region of the device, the etch extending at least into the depleted region proximate to the forward blocking semiconductor junction underlying the gate region of the device.

5 Claims, 3 Drawing Figures

SELF-PROTECTING SEMICONDUCTOR DEVICE

This invention relates, in general, to semiconductor devices and, more particularly, to triggerable semiconductor switch devices which are self-protected against destruction due to voltage breakdown initiated turn-on.

It has been a problem of semiconductor switching devices that, when subjected to overvoltage stresses, breakdown occurs in unpredictable fashions in various portions of the device. Depending upon localized characteristics of a device, the maximum breakdown voltage may vary substantially and unpredictably through the device. It is therefore difficult to predict where breakdown will occur and protect the device from the uncontrolled turn-on process initiated thereby. Many methods have been proposed to increase the breakdown voltage of a device, as for example, beveling of the edges of the device in order to reduce the electric field intensities at the edge. Passivation of edge junctions is a further method for reducing the electric fields present at the junctions. These techniques provide devices of increased avalanche breakdown voltage rating but do not provide protection for the device in the event that the ultimate breakdown voltage is exceeded.

External circuits connected between the anode and gate of thyristor devices having breakdown voltages less than the ultimate breakdown voltage of the device have usefully been employed. This type of protection results in the device turning on when subjected to a voltage in excess of that which would otherwise cause destructive avalanche breakdown. While external circuits of this type have been known to be effective, they add to the cost of the device both economically and in terms of complexity.

It is an object therefore of this invention to provide a self-protecting thyristor structure which, when subjected to voltages in excess of the breakdown voltage of the device, turns on in a controlled manner rather than breaking down in a destructive fashion.

It is another object of this device to provide a thyristor structure which does not require external protective circuitry, but rather which, by virtue of its internal structure, provides self-protection.

It is yet another object of this invention to provide a self-protecting thyristor structure which may be fabricated in accordance with the existing technologies without the need for expensive special processing steps.

Briefly stated, and in accordance with one aspect of this invention, a self-protecting thyristor structure is provided which includes a controlled etched-down region in the gate region of the thyristor having a predetermined breakdown voltage characteristic which is less than the breakdown voltage characteristic of the remainder of the device. In this manner, breakdown will occur in a predictable fashion within a gate region of the device thereby causing the device to turn-on in a controlled manner rather than to fail catastrophically.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
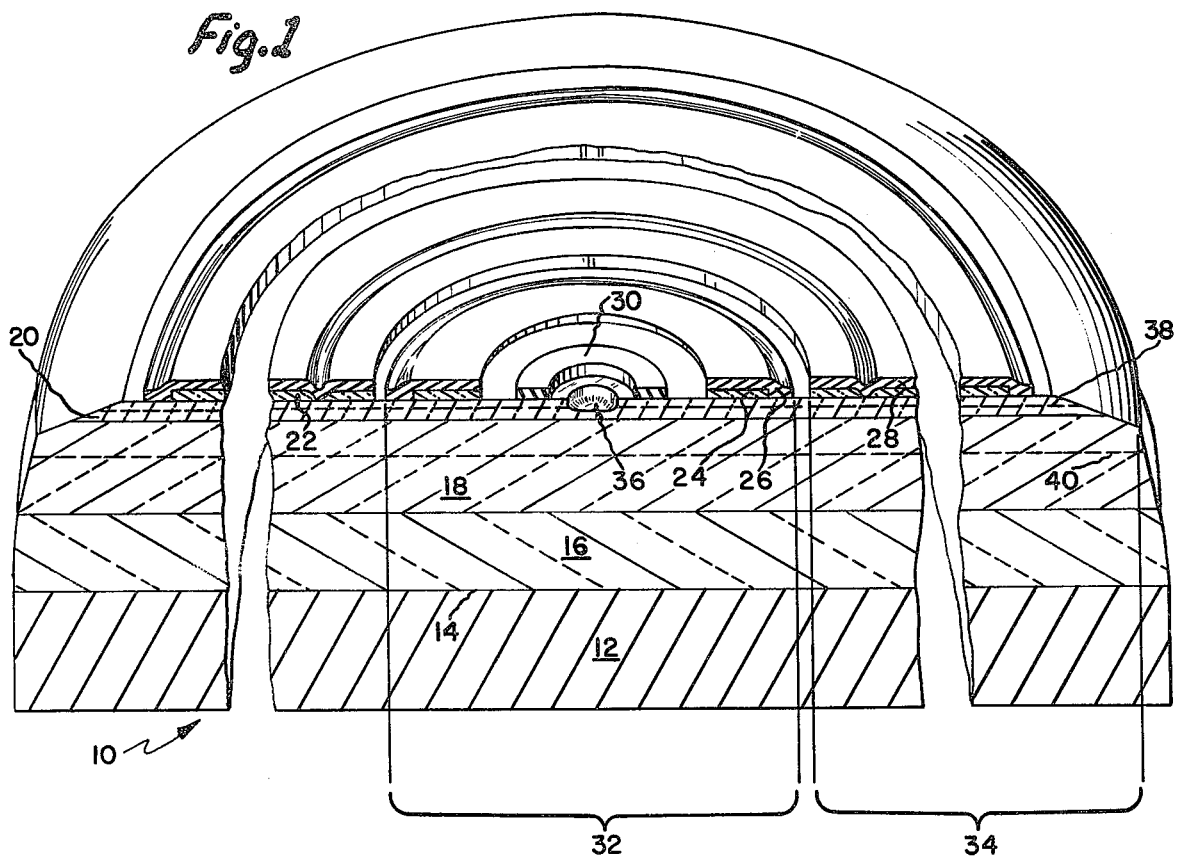
FIG. 1 is a section view of a thyristor in accordance with one embodiment of this invention.

A semiconductor device in accordance with this invention is illustrated at FIG. 1. A thyristor, designated generally at 10, is provided having a conductive electrical contact 12 ohmically contacting surface 14 of anode semiconductor layer 16. In this exemplary embodiment of the invention, anode semiconductor layer 16 is of p-conductivity type semiconductor material. It will be understood that while a device having a p-type anode is described that this invention is not so limited and may be applied, if desired, to reverse conductivity type thyristors. An n-conductivity type first base layer 18 overlies anode 16 forming a first semiconductor junction therebetween. P-type base layer 20 overlies n-type base layer 18 and forms a second semiconductor junction therebetween. N-conductivity type emitter layer 22 overlies a portion of p-type base layer 20 and is of annular configuration. A second n-type conductivity region 24 also overlies p-type base region 20 and forms in conjunction with metallization 26 a pilot thyristor of the type well known to those skilled in the art. Cathode metallization 28 overlies n-type emitter 22. Gate metallization 30 which is also of annular configuration further overlies p-type base region 20 and is within pilot thyristor region 32 which is within main emitter region 34. Electrode 30 is adapted for the connection of a gate signal source thereto for triggering the SCR. Etched down region 36 lies within the interior of pilot thyristor region 32. It will be appreciated that upon the application of an electrical potential to device 10, a depletion region is formed in the vicinity of the semiconductor junction between layers 18 and 20. The extent of the depletion region is dependent upon the magnitude of the potential applied to the device and upon the particular impurity concentrations of the device layers. Etched-down region 36 is sufficiently deep that it extends into the depletion region. For purposes of illustration, the extent of the depleted region is indicated at FIG. 1 by dotted lines 38 and 40.

For purposes of this invention, region 36 is characterized as an "etched-down region". It is to be understood that the formation of region 36 need not necessarily be accomplished by etching but may, in fact, be by any method known to those skilled in the art for forming cavities in semiconductor devices. It will be clear that etched-down region 36 could be formed, for example, by drilling or sandblasting away the undesired material so long as sufficient precision of depth could be maintained.

In a preferred embodiment of this invention, region 36 is formed by etching since high degree of precision can be obtained. It may be desirable to form etched-down region 36 either at the time of formation of the device or alternately after other fabrication steps have been completed. It may be advantageous in the implementation of a device in accordance with this invention to provide etched-down region 36 after the breakdown characteristics of the thyristor have been determined. For example, assume that a semiconductor device substantially identical to device 10 is fabricated save only that etched-down region 36 is eliminated therefrom. Suppose further, that it is determined that the avalanche breakdown voltage of the device is, for example, 3600 volts. It is desirable, therefore, in accordance with this invention to provide an etch of sufficient depth that the breakdown voltage in the region of the etch is less than 3600 volts. In this way, the behavior of the device when subjected to an excess of voltage over, for example, 3500 volts may be predicted. Current flow will occur first in the region proximate to etched-down region 36. Current will flow beneath pilot thyristor region 32 causing it to turn on which in turn will cause main semiconductor region 34 to turn on.

It is emphasized that a device constructed in accordance with this invention will not have a higher breakdown voltage than prior art devices, but rather will not be subject to destructive failure upon the application of voltages thereto in excess of the breakdown voltage. A device of this type will be appreciated to be especially useful in applications wherein series strings of thyristors are employed in order to control voltages larger than breakdown voltages of the individual devices. It is often times a problem that a particular thyristor in a series string of the type hereinabove described will fail, for one reason or another, to turn-on in response to a gate turn-on signal applied thereto. Assuming that all other thyristors in said string of thyristors turn on in response to gate signals applied thereto, the thyristor failing to turn on will be subjected to voltages which may exceed the breakdown voltage of the device. It is desirable, therefore, that the device which fails to turn on be protected from destruction due to avalanche breakdown and the subsequent uncontrolled turn-on. A device in accordance with this invention will turn on in the conditions hereinabove described and therefore will be self-protected.

Figure 2:
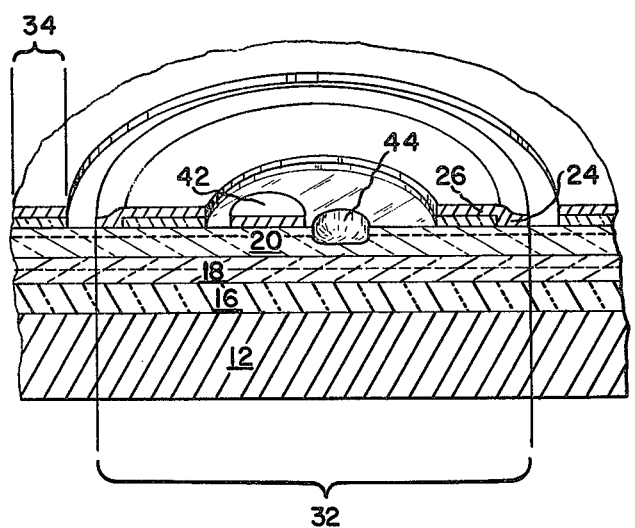
FIG. 2 is a section view of a thyristor in accordance with an alternative embodiment of this invention.

An alternative embodiment of this invention is illustrated at FIG. 2. Like numbered elements with those of FIG. 1 perform like functions. It will be appreciated that the device of FIG. 2 is substantially identical to that of FIG. 1 save only for the arrangement of the etched-down region and the gate electrode. FIG. 2 illustrates an embodiment of this invention wherein gate electrode 42 does not include the area of etched-down region 44. It is emphasized that a device in accordance with this invention may provide an etched-down region included totally, in part, or not at all within the gate electrode of the device. It is presently preferred that the etched-down region be located within the gate region so that the device, upon being turned on by the application of an excess of voltage thereto, will turn-on in a uniform manner. It will be seen that, by reference to FIG. 2, the positioning of the gate electrode and etched-down region as depicted therein may provide for initial turn-on of the pilot thyristor region 32 in a relatively smaller area than would be effected by the structure of FIG. 1. Similarly, the positioning of gate electrode 42 at other than the center of pilot thyristor 32 may have the same effect. This may be desirable in some instances in that the sensitivity of the gate region to turn-on by signals applied to the gate electrode and to turn-on by avalanche breakdown currents may be separately determinable.

Figure 3:
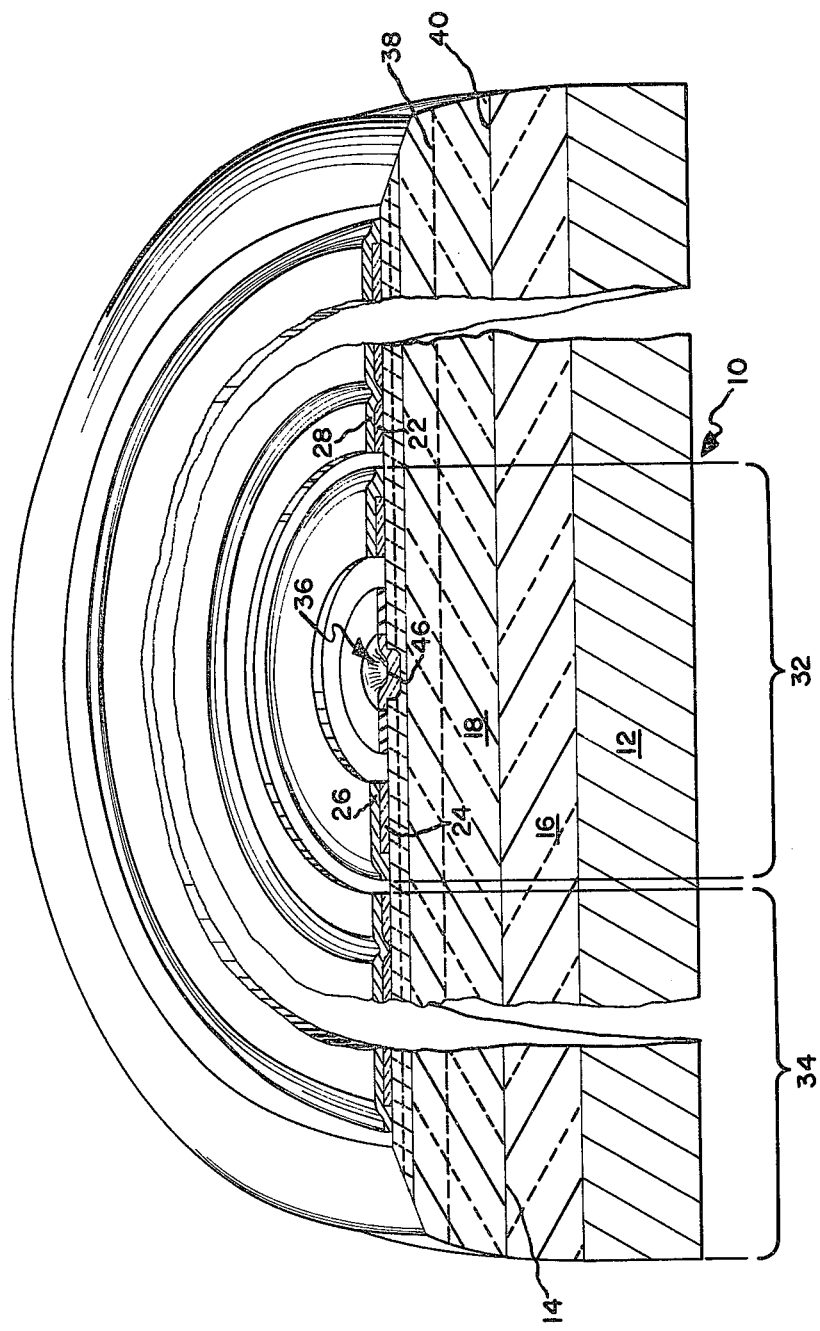
FIG. 3 is a section view of a thyristor in accordance with another alternative embodiment of this invention.

FIG. 3 illustrates another alternative embodiment of this invention similar to that illustrated in FIG. 1. Again, like reference numerals denote like elements in the drawing. FIG. 3 differs from FIG. 1 in that a passivating material overlies etched-down region 36 and the gate region of the device. Passivating layer 46 provides a dual function. It is often times desirable to provide thyristors of the type with which this invention is concerned having the capability to be triggered by radiation. Accordingly, FIG. 3 illustrates a light sensistive thyristor in accordance with this invention. Passivating layer 46 may conveniently be fabricated of an anti-reflective material to enhance the light-fired characteristics of the device. Anti-reflective materials are well known in the art and are commonly dielectrics. It will be appreciated, therefore, that the characteristics of the etched-down region will be modified somewhat by the addition of the dielectric passivating material thereover. It has been found that the addition of passivating layer 46 reduces the magnitude of the electric field created by a particular voltage in the area of the etched-down region. Accordingly, in order to provide a device having similar self-protective characteristics etched-down region 36 must be extended somewhat further into the depletion region of the device.

It will be appreciated that the light sensitive area of device 10 of FIG. 3, which is the annular area between the etched-down region and the inside edge of power thyristor region 32 may be varied somewhat from the thickness illustrated in FIG. 3. As is well known, it is often times desirable to decrease the thickness of p-base layer 20 in order to provide more effective radiation triggered generation of charge carriers in the area of the junction between layers 18 and 20.

The following table illustrates the relation between the etch depth, the avalanche multiplication factor and the maximum electric field intensity for an exemplary thyristor in accordance with this invention.

| CASE | ETCH DEPTH (mils) | AVALANCHE MULTIPLICATION FACTOR "M" | MAXIMUM ELECTRIC FIELD (v/cm) | APPLIED VOLTAGE |
|---|---|---|---|---|
| Etched Region Left as Bare Silicon | 2.2 | 1.23 | $1.67 \times 10^5$ | 3500 |
|  | 2.4 | 1.64 | $1.74 \times 10^5$ | 3500 |
|  | 2.6 | 2.89 | $1.98 \times 10^5$ | 3500 |
|  | 2.8 | ∞ | $2.09 \times 10^5$ | 3500 |
| Etched Region Filled With Passivant ($68_G = 8$) | 2.4 | 1.27 | $1.68 \times 10^5$ | 3500 |
|  | 2.6 | 1.55 | $1.72 \times 10^5$ | 3500 |
|  | 2.8 | 2.48 | $1.76 \times 10^5$ | 3500 |
|  | 3.0 | 11.09 | $1.81 \times 10^5$ | 3500 |

The device to which the foregoing applies is characterized by an n-base impurity concentration of $3 \times 10^{13} cm^{-3}$, which is a common magnitude for n-base layers and high voltage thyristors of the type to which this invention is addressed. The p-base layer is formed by lapping off the top three mils of a seven mil diffusion. The p-base depletion width is 1.9 mils at 3500 volts. It is seen by reference to the table that as the etch depth increases in each of the two cases, the avalanche multiplication factor also increases. In the case where the etch region is not passivated, the avalanche multiplication factor at 3500 volts increases to infinity at an etch depth of 2.8 mils. This indicates that an etch depth of 2.8 mils is sufficient to insure that the device will fire at 3500 volts. Assume, for example, that the maximum breakdown voltage of the device without the etch is 3600 volts, it will be seen that the device is self-protected. The table also illustrates the effect of passivation on the avalanche multiplication factor. It will be seen that with the passivant having a dielectric constant ($\epsilon_G$) of eight, the avalanche multiplication factors for each etch depth are decreased substantially. It will be appreciated that at an etch depth of 3.0 mils an avalanche multiplication factor sufficient to insure firing at 3500 volts is achieved.

While the etch depth required to achieve a given breakdown voltage in the gate region of the device may be calculated, it is often times advantageous in accordance with this invention to determine the etch depth empirically. In accordance herewith, a sample semiconductor from a single batch processed identically would be selected and the breakdown voltage in the absence of an etch determined. A second device is then provided with an etch extending at least into the depletion region at the breakdown voltage. Those skilled in the art will appreciate that the initial determination of the extent of the depleted region proximate to a semiconductor junction will depend upon the nature of the junction. Junctions may be characterized as abrupt, diffused, graded, or constant impurity to name several exemplary types of impurity concentrations. It is often advantageous to provide thyristors having different impurity concentration profile types on the two sides of the junction. For example, a typical thyristor may be fabricated with a diffused p-type base region and a uniformly doped n-type base region. It is the extent of the depleted region extending into the p-type region which must be determined in order to provide an initial etch in accordance with this invention. It is emphasized that where it is not desired to determine the extent of the depleted region that it need not be accomplished and, in fact, the etch may be started at zero depth and increased in small increments until the desired breakdown voltage is obtained. The only advantage attendant beginning the etch a depth equal to the boundary of the depleted region is that fewer etching steps will be necessary to reach the ultimately desired depth.

A general method for calculating the depletion region width is discussed as follows. The voltage in the region of a semiconductor junction on the p-type side of the junction may be expressed as $$V_p = - \int_0^{W_p} E(x) \, dx \qquad \text{(equation 1)}$$

where $$E(W) = E(o) - \int_0^W \frac{q N_A(x) \, dx}{\epsilon} \qquad \text{(equation 2)}$$

where $x$ is the distance from the junction, $\epsilon$ is the dielectric constant for silicon and $W_p$ is the p layer depletion width corresponding to $V_p$, the p region voltage. $N_A(x)$ is the net acceptor density above the donor concentration at $x$ and $q$ is the charge of an electron. Similar relationships define the voltage on the other side of the junction:

$$V_n = \int_{-W_n}^{0} - E(x) \, dx \qquad \text{(equation 3)}$$

where $$E(X) = \int_{-W_n}^{X} \frac{- q N_D(x) \, dx}{\epsilon} \qquad \text{(equation 4)}$$

where $N_D(x)$ is the net donor concentration above the acceptor concentration at $x$ and $W_n$ is the depletion region width of the n-type layer for a voltage of $V_n$ across it. $W_n$ and $W_p$ are solved by (1) first guessing a value for $W_n$, (2) using equations (3) and (4) to find V and E(o), (3) increasing W in equation (2) until E(W) = o. $W_p$ is set equal to that value and $V_p$ is then calculated using equation (1). If the device voltage ($V_n + V_p$) is larger than the desired breakover voltage, a smaller value of $W_n$ is picked and the calculation procedure repeated. Often it is convenient to solve the equations graphically. Graphs for various junctions may be found, for example, in Phillips, Transistor Engineering, McGraw Hill Book Company, New York, 1962, pp. 116 et seq. The etch depth is increased until the device turns on at a desired voltage less than the breakdown voltage hereinbefore determined. This method is most advantageously employed when substantial uniformity of devices in a single batch is achievable. In order to achieve a high degree of reliability in the self-protection feature, it is desirable to establish the breakdown voltage in the gate region sufficiently below the breakdown voltage of the device to insure that the breakdown voltage of any particular device will be above that selected as the self-protect breakdown. Similarly, it is undesirable to provide an etch which decreases the breakdown voltage below that which is necessary to provide protection for substantially all devices in a batch. Those skilled in the art will readily appreciate the trade-offs necessary between maximum protection and maximum breakdown voltage. A typical value in accordance with this invention has been found to be approximately 5% below the ultimate breakdown voltage of a device without an etched down region.

While this invention has been described in conjunction with certain specific embodiments thereof and particularly with respect to amplifying gate thyristor structures including an etched down region in accordance with the invention, it will be appreciated by those skilled in the art that many modifications and changes may be made without departing from the true spirit and scope of the invention. For example, it may be desirable in certain devices to omit the pilot thyristor region interposed between the etched down region and the main thyristor region. It will be understood that the device obtained by this omission will differ substantially in its characteristics from a device including a pilot thyristor region and therefore it will be necessary to provide a device having adequate sensitivity and speed of turn-on to prevent destruction of the device when the gate region turns on. As was hereinabove described in a presently preferred embodiment of this invention, a pilot thyristor is utilized. Devices without a pilot thyristor, that is to say nonamplifying gate thyristors should be expected to be practical only for relatively low power, low voltage applications.

While the invention has been described in conjunction with center gated devices, it will be apparent to one skilled in the art that the invention disclosed herein applies equally well to edge gated devices. The invention relies upon the provision of an etched-down region in the area of the gate such that the avalanche breakdown voltage proximate to the gate region is lower than the avalanche breakdown voltage in the remaining portions of the device. The further requirement that the the device turn-on at a rate sufficiently rapid to prevent the destruction of the device in the initial turn-on region before the current flowing therein is distributed through the mechanism of a controlled turn-on to a large enough area to effectively dissipate. It will also be appreciated that the topology of the pilot (amplifying gate) thyristor and the topology of the main thyristor need not be annular in accordance with invention, and that other topologies may equally well be employed.

While the invention has been described in conjunction with certain presently preferred embodiments thereof along with several alternatives thereto, it will be understood that one skilled in the art will perceive certain other modifications and changes which may be made without departing from the true spirit and scope of the invention as defined in the appended claims.

What is claimed is:

1. In combination with a self-protected thyristor device including a p-type conductivity layer comprising the anode of said device, an n-type conductivity layer overlying said p-type conductivity layer and forming a first p-n junction therebetween, a second p-type conductivity layer overlying said n-type conductivity layer and forming a second p-n junction therebetween, a second n-type conductivity layer of annular configuration overlying a portion of said p-type conductivity layer and forming the main emitter of said device, a pilot thyristor region including a third n-type conductivity layer of annular configuration also overlying said second p-type conductivity layer and within the annular configuration of said main emitter, said third layer forming the pilot emitter of said device, and a gate region including an electrode contacting said second p-type region within the annular region of said pilot emitter, the improvement comprising:

an etched region in said gate region, said etched region extending from the surface of said second p-type conductivity region for a sufficient depth in said second p-type region to reduce the breakdown voltage in said gate region below the breakdown voltage of said second p-n junction, said etched region providing a localized region of increased avalanche multiplication factor to insure that maximum current density at the onset of avalanche voltage breakdown occurs in the gate region, thereby causing said device to turn on in a controlled manner and prevent damage to said device.

2. The combination of claim 1 wherein said etched region extends into the depletion region of said second p-n junction.

3. The combination of claim 2 wherein the breakdown voltage in said gate region is at least 5 percent less than the breakdown voltage of said second p-n junction.

4. The combination of claim 2 wherein said thyristor device is light triggered.

5. The combination of claim 2 further comprising:

an antireflective passivating layer overlying said etched region.

* * * * *

UNITED STATES PATENT OFFICE
CERTIFICATE OF CORRECTION

Patent No. 4,087,834        Dated May 2, 1978

Inventor(s) Victor Albert Keith Temple

It is certified that error appears in the above-identified patent and that said Letters Patent are hereby corrected as shown below:

Column 3 and 4, lines 41-54

| CASE | ETCH DEPTH (mils) | AVALANCHE MULTIPLICATION FACTOR "M" | MAXIMUM ELECTRIC FIELD (v/cm) | APPLIED VOLTAGE |
|---|---|---|---|---|
| Etched Region Left as Bare Silicon | 2.2 | 1.23 | $1.67 \times 10^5$ | 3500 |
|  | 2.4 | 1.64 | $1.74 \times 10^5$ | 3500 |
|  | 2.6 | 2.89 | $1.98 \times 10^5$ | 3500 |
|  | 2.8 | $\infty$ | $2.09 \times 10^5$ | 3500 |
| Etched Region Filled With Passivant ($\varepsilon_G = 8$) | 2.4 | 1.27 | $1.68 \times 10^5$ | 3500 |
|  | 2.6 | 1.55 | $1.72 \times 10^5$ | 3500 |
|  | 2.8 | 2.48 | $1.76 \times 10^5$ | 3500 |
|  | 3.0 | 11.09 | $1.81 \times 10^5$ | 3500 |

Signed and Sealed this

Twenty-seventh Day of November 1979

[SEAL]

Attest:

RUTH C. MASON
Attesting Officer

LUTRELLE F. PARKER
Acting Commissioner of Patents and Trademarks